United States Patent [19]

Miura

[11] Patent Number: 5,754,616
[45] Date of Patent: May 19, 1998

[54] TWO-PHASE COUNTER CIRCUIT

[75] Inventor: Hiromichi Miura, Tokyo, Japan

[73] Assignee: Mitsubishi Denki Kabushiki Kaisha, Tokyo, Japan

[21] Appl. No.: 712,626

[22] Filed: Sep. 11, 1996

[30] Foreign Application Priority Data

Apr. 25, 1996 [JP] Japan ................................ 8-105596

[51] Int. Cl.$^6$ ........................................ H03K 21/16
[52] U.S. Cl. .................... 377/115; 377/43; 377/78
[58] Field of Search ............................ 377/43, 54, 78, 377/115

[56] References Cited

U.S. PATENT DOCUMENTS

| | | | |
|---|---|---|---|
| 4,574,386 | 3/1986 | Kinghorn | 377/105 |
| 4,845,728 | 7/1989 | Truong et al. | 377/69 |
| 4,961,207 | 10/1990 | Wittmer et al. | 377/43 |
| 5,230,014 | 7/1993 | Benhamida | 377/115 |
| 5,339,344 | 8/1994 | Kimura et al. | 377/39 |

Primary Examiner—Margaret Rose Wambach
Attorney, Agent, or Firm—Leydig, Voit & Mayer, LTD.

[57] ABSTRACT

A counter operated on the 2-phase clock which divides a lag time occurring in shift circuits into two parts, one being on the basis of a first clock and the other being on the basis of a second clock, the lag time in each part being independently accumulated so as to diverge the lag time, thereby speeding up the operation of the counter.

14 Claims, 13 Drawing Sheets

TWO-PHASE COUNTER CIRCUIT

BACKGROUND OF THE INVENTION

1. Field of the Invention

The present invention relates to a counter operable in response to a two-phase clock.

2. Description of Related Art

A multi-bit counter is known which counts as one cycle of two-phase clock. This type of counter latches data in synchronism with a clock in one phase and shifts the latched data, then latches the shifted data in synchronism with the clock in the other phase. This known counter is generally constructed as illustrated in FIG. 1. FIG. 1 is a block diagram illustrating the structure of a 4-bit up-counter whose count source is one cycle of two-phase clock.

A latch circuit 1a, a shift circuit 3a, and a latch circuit 2a constitute a first circuit 5. A latch circuit 1b, a shift circuit 3b, and a latch circuit 2b constitute a second circuit 6. A latch circuit 1c, a shift circuit 3c, and a latch circuit 2c constitute a third circuit 7. A latch circuit 1d, a shift circuit 3d, and a latch circuit 2d constitute a fourth circuit 8.

In the first circuit 5 the data value 21 of the latch circuit 1a is inputted to the shift circuit 3a, and the data value 31 of the shift circuit 3a is inputted to the latch circuit 2a. The data value of the latch circuit 2a is inputted to the latch circuit 1a. Likewise, in the second, third and fourth circuits 6, 7 and 8 the data values 22, 23, and 24 of the latch circuits 1b, 1c and 1d are respectively inputted to the shift circuits 3b, 3c and 3d, the data values 32, 33, 34 of the shift circuits 3b, 3c and 3d are respectively inputted to the latch circuits 2b, 2c, and 2d. The data values of the latch circuit 2b, 2c and 2d are respectively inputted to the latch circuits 1b, 1c, and 1d.

A clock P1 of the two-phase clock is inputted to each of the latch circuits 1a, 1b, 1c, and 1d, and the other clock P2 thereof is inputted to the latch circuits 2a, 2b, 2c, and 2d. The shift circuit 3a receives a carry signal 11, and a carry signal 12 outputted by the shift circuit 3a is inputted to the shift circuit 3b. A carry signal 13 outputted by the shift circuit 3b is inputted to the shift circuit 3c, and the carry signal 14 outputted by the shift circuit 3c is inputted to the shift circuit 3d. The first circuit 5 bears a least significant bit, and the fourth circuit 8 bears a most significant bit.

The latch circuits 1a, 1b, 1c, and 1d fetch inputted data values when the clock P1 is "1", and latch it when the clock P1 is "0". The latch circuits 2a, 2b, 2c, and 2d fetch inputted data values when the clock P2 is "1", and latch it when the clock P2 is "0". The shift circuits 3a, 3b, 3c, and 3d execute the shift operation as shown in TABLE 1:

TABLE 1

| TYPE | 1 | 2 | 3 | 4 |
|---|---|---|---|---|
| Input Value | 0 | 1 | 0 | 1 |
| Input Carry Signal | 0 | 0 | 1 | 1 |
| Output Value | 0 | 1 | 1 | 0 |
| Output Carry Signal | 0 | 0 | 0 | 1 |

In the case of Type (1) where the input value from the latch circuit is "0" with no carry signal being inputted, that is "0", no shift operation is effected; therefore, the output value becomes "0". In this case, the carry signal becomes "0", so that it is not outputted. In the case of Type (2) where the input value from the latch circuit is "1" with no carry signal being inputted, no shift operation is effected, and the output value becomes "1". In this case, the carry signal becomes "0", so that it is not outputted. In the case of Type (3) where the input value is "0" with a carry signal being inputted, that is "1", a shift operation is effected, and the output value becomes "1". In this case, no carry signal is outputted. In the case of Type (4) where the input value is "1" with a carry signal being inputted, a shift operation is effected, and the output value becomes "0". In this case, a carry signal is outputted.

The operations of the counter will be described by referring to the timing chart shown in FIG. 2. As shown in FIG. 2, the clocks P1 and P2 have the same cycle and the same waveform, and the clock P2 becomes synchronous with the clock P1 after it is delayed by half cycle. The carry signal 11 has a level fixed to "1".

Now, the count operations from "0, 1, 1, 1" up to "1, 0, 0, 0" and from "1, 0, 0, 0" up to "1, 0, 0, 1" will be described:

In synchronism with the clock P1, the data values 21, 22, 23, and 24 of the latch circuits 1a, 1b, 1c and 1d become "1", "1", "1", and "0". Since the carry signal 11 is "1", the shift circuit 3a is operated, thereby shifting data value 21 of "1". As a result, the shift circuit 3a outputs data value 31 of "0" to the latch circuit 2a, and as shown in FIG. 2, the carry signal 12 is outputted to the shift circuit 3b. Then, the shift circuit 3b shifts data value 22 of "1" in response to the carry signal 12. As a result, the data value 32 outputted to the latch circuit 2b from the shift circuit 3b becomes "0", and the shift circuit 3b outputs a carry signal 13 to the shift circuit 3c.

In response to the carry signal 13, the shift circuit 3c shifts data value 23 of "1". As a result, the data value 33 from the shift circuit 3c becomes "0" as shown in FIG. 2, and the shift circuit 3c outputs a carry signal 14 in response to which the shift circuit 3d shifts the data value 24 of "0". As a result, the data value 34 from the shift circuit 3d becomes "1" as shown in FIG. 2. In this way, the latch circuits 2a, 2b, 2c, and 2d latch the data values 31, 32, 33, and 34 of "0", "0", "0" and "1" in synchronism with the clock P2, and the count value become "1, 0, 0, 0".

Subsequently, the data values 21, 22, 23, and 24 become "0", "0", "0" and "1" in synchronism with the next clock P1. At this stage, since the carry signal 11 is constantly outputted, the shift circuit 3a shifts the data value 21 of "0". As a result, the data value 31 outputted from the shift circuit 3a becomes "1" as shown in FIG. 2, thereby outputting no carry signal 12 from the shift circuit 3a. Since no carry signal 12 is outputted, the shift circuit 3b is prevented from executing the shift operation, and the data value 32 outputted from the shift circuit 3b becomes "0", thereby outputting no carry signal 13. Because of outputting no carry signal 13, the shift circuit 3c is prevented from executing the shift operation. Thus the data value 33 outputted from the shift circuit 3c becomes "0", thereby outputting no carry signal 14. Because of no carry signal 14, the shift circuit 3d is prevented from executing the shift operation, and the data value 34 from the shift circuit 3d becomes "1". In synchronism with the clock P2 the data values 31, 32, 33 and 34 of "1", "0", "0", and "1" are respectively latched by the latch circuits 2a, 2b, 2c, and 2d, thereby obtaining the count value "1, 0, 0, 1".

Each of the shift circuits 3a, 3b, 3c, and 3d takes time in executing the shift operation, and when the data value changes from "1" to "0", the carry signal 11, 12, 13, and 14 are respectively outputted from the shift circuits 3a, 3b, 3c, and 3d each upon lapse of a lag time. More specifically, because of the constant input of the carry signal 11, the shift circuit 3a outputs the shifted data value 31 upon lapse of a lag time $\delta_1$ from the rising time of the clock P1, and at the same time, outputs the carry signal 12. The shift circuit 3b outputs the shifted data value 32 upon lapse of a lag time $\delta_1$ from the rising time of the carry signal 12, and at the same time, outputs the carry signal 13. The shift circuit 3c outputs the shifted data value 33 upon lapse of a lag time $\delta_1$ from the rising time of the carry signal 13, and at the same time, outputs the carry signal 14. The shift circuit 3d outputs the shifted data value 34 upon lapse of a lag time $\delta_1$ from the rising time of the carry signal 14.

In this way the counter determines data values in a range of most significant bit to least significant bit during the period of time from the rising time of the clock P1 up to the falling point of the clock P2.

However, the shift operation of each of the shift circuits 3a, 3b, 3c, and 3d involves a lag time $\delta_1$ so that it takes the build-up of lag times $\delta_1$ which each of the shift circuits 3a, 3b, 3c and 3d take before the value of most significant bit determines after the rising time of the clock P1. The time T from the determination of the most significant bit up to the falling time of the clock P2 is shortened. Under this situation, the attempt to heighten the frequency of the clock P1 and P2 with a view to operating the counter at higher speed will not be fully achieved because of the impossibility of shortening the cycles of the clocks P1 and P2 less than the period of time T. As a result, the range of heightening the frequencies of the clock P1 and P2 is limited.

The greater the number of bits is, the longer time the build-up of lag times takes, so that the frequency of the clocks P1 and P2 is more limited. As a result, the counter cannot be operated at a higher speed.

SUMMARY OF THE INVENTION

The present invention has been made to solve the problems pointed out above, and an object of the invention is to provide a counter capable of rapid count operation by reducing the influence of a lag time likely to occur in the shift operations of the shift circuits. Another object of the present invention is to provide a counter permitting the count values to be rewritten during the count operation. Another object of the present invention is to provide a counter capable of reading count values during the count operation.

According to the present invention, the counter includes a first counting division including a first latch circuit for latching data in synchronism with a first clock; a first shift circuit for fetching data latched by the first latch circuit, and outputting data shifted in response to a shift instruction data and outputting the shift instruction data when a predetermined shift operation occurs; and a second latch circuit for latching data outputted by the first shift circuit in synchronism with a second clock, and latching the latched data to the first latch circuit, and a second countering division including a third latch circuit for latching data in synchronism with the second clock, a second shift circuit for fetching data latched by the third latch circuit, and outputting data shifted in response to a shift instruction data and outputting the shift instruction data when a predetermined shift operation occurs; and a fourth latch circuit for latching data outputted by the second shift circuit in synchronism with the first clock, and latching the latched data to the third latch circuit; and a fifth latch circuit for latching the shift instruction data outputted from the first shift circuit, and outputting the latched data to the second shift circuit, wherein the second latch circuit and the third latch circuit respectively obtain data about a lower-order bit and an upper-order bit of a count value obtained by counting on the basis of the first clock and second clock.

According to-the present invention, the counter includes a plurality of first counting divisions and second counting divisions, the first shift circuits consecutively outputting the shift instruction data from the lower-order bit side to the upper-order bit side, the second shift circuits consecutively outputting the shift instruction data from the lower-order bit side to the upper-order bitside, the fifth latch circuit latches the shift instruction data outputted from the final stage of the first shift circuits, and outputs the latched shift instruction data to the first stage of the second shift circuits.

As a result, the lag time occurring in the shift circuit is divided into two parts, one being on the basis of a first clock and the other being on the basis of a second clock, the lag time in each part being independently accumulated so as to shorten the respective lag time, thereby heightening the frequency of the first clock and second clock. Thus the count operation is carried out at high speed.

Furthermore, the counter of the present invention is provided with data writing circuits for writing data in the first latch circuit(s) and the fourth latch circuit(s).

As a result, in response to a write control signal in synchronous with the first clock, data is written in the first latch circuit in the first counting division, and in the fourth latch circuit in the second counting division.

Thus, the count values are permitted to be rewritten during the count operation, thereby making the counter applicable to any use in which the count values are necessarily changed.

Furthermore, the counter of the present invention is provided with data writing circuits for writing data in the first latch circuit(s) and the third latch circuit(s).

As a result, in response to a write control signal in synchronous with the first clock, data is written in the first latch circuit in the first counting division, and in response to a write control signal in synchronous with the second clock, data is written in the third latch circuit in the second counting division. Thus, the count values are permitted to be rewritten during the count operation, thereby making the counter applicable to any use in which the count values are necessarily changed.

Furthermore, the counter of the present invention is additionally provided with a first data-reading circuit for reading data from the first latch circuit, and a second data-reading circuit for reading data to be inputted to the third latch circuit.

As a result, the data of the second latch circuit in the first counting division is read out in response to a read control signal synchronous with the first clock, and the data to be inputted to the fourth latch circuit is read out. This makes it possible to read a count value during the count operation, thereby making the counter applicable to any use in which a count value is necessarily read at a desired point of time during the count operation.

Furthermore, the counter of the present invention is additionally provided with a data-reading circuit for reading data from the second latch circuit, a sixth latch circuit for latching the data read by the data-reading circuit, and a seventh latch circuits for latching the data of the fourth latch circuit.

As a result, the data-reading circuits read the data of the second latch circuit in the first counting division in response to a read control signal synchronous with the first clock, and the seventh latch circuit the data read by the data-reading circuit and the data of the fourth latch circuit in the second countering division in response to a read control signal synchronous with the second clock. This makes it possible to read data during the count operation, thereby making the counter applicable to any use in which a count value is necessarily read at a desired point of time during the count operation.

The above and further objects and features of the invention will more fully be apparent from the following detailed description with the accompanying drawings.

DESCRIPTION OF THE PREFERRED EMBODIMENTS

The present invention will be described more particularly by way of example by referring to the accompanying drawings:

Embodiment 1

Figure 3:
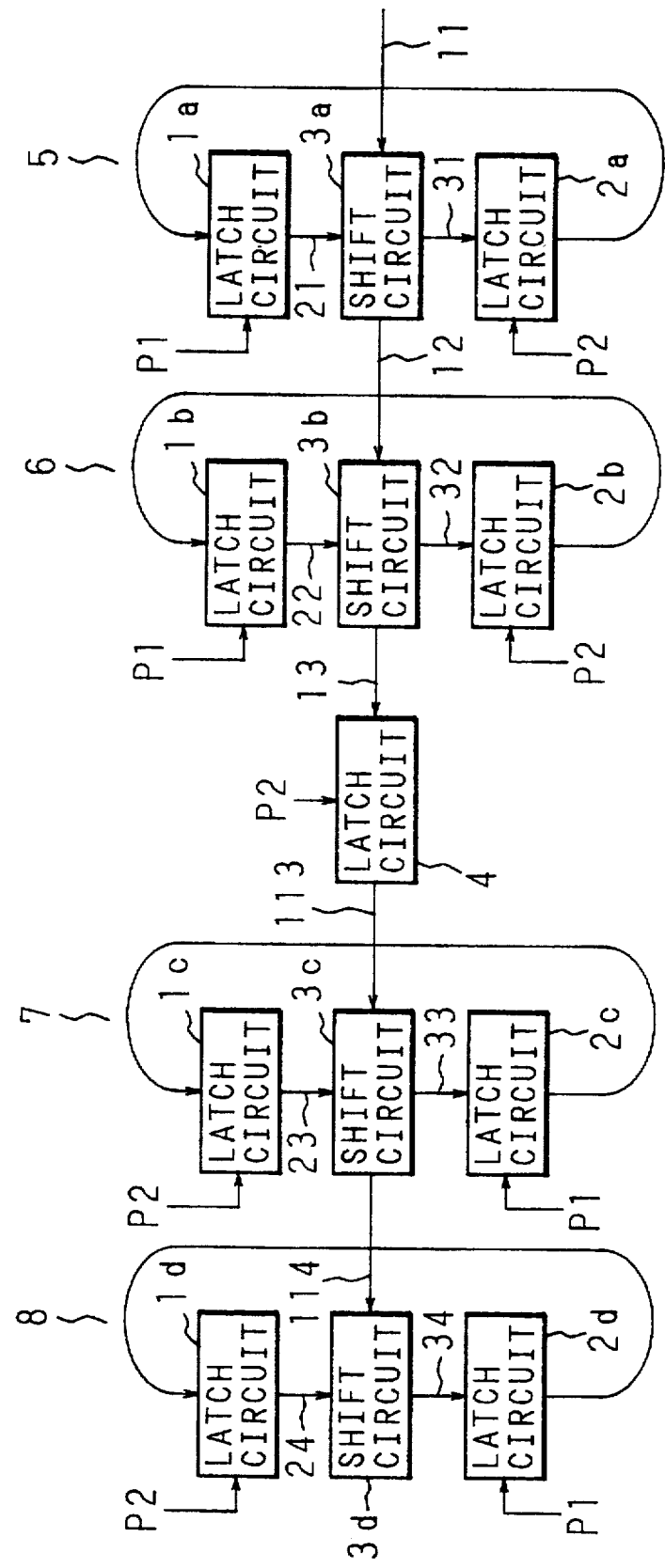
FIG. 3 is a block diagram illustrating a first embodiment of the present invention.

FIG. 3 is a block diagram illustrating the structure of Embodiment 1. The illustrated counter is a 4-bit up-counter. A first circuit 5 is constituted by a latch circuit 1a, a shift circuit 3a and a latch circuit 2a. A second circuit 6 is constituted by a latch circuit 1b, a shift circuit 3b, and a latch circuit 2b. A third circuit 7 is constituted by a latch circuit 1c, a shift circuit 3c, and a latch circuit 2c, and a fourth circuit 8 is constituted by a latch circuit 1d, a shift circuit 3d, and a latch circuit 2d. The first and second circuits 5 and 6 are to obtain count values of lower order bits, and the third and fourth circuits 7 and 8 are to obtain count values of upper-order bits.

The data values 21, 22, 23, and 24 of the latch circuits 1a, 1b, 1c, and 1d are respectively inputted to the shift circuits 3a, 3b, 3c, and 3d. The data values 31, 32, 33, and 34 of the shift circuits 3a, 3b, 3c, and 3d are respectively inputted to the latch circuits 2a, 2b, 2c, and 2d. The data values of the latch circuits 2a, 2b, 2c, and 2d are respectively inputted to the latch circuits 1a, 1b, 1c, and 1d. The latch circuits 1a and 1b, and the latch circuits 2c and 2d receive a clock P1 of the two-phase clock. The latch circuits 2a and 2b, and the latch circuits 1c and 1d receive the other clock P2. The shift circuit 3a receives a carry signal 11 and outputs a carry signal 12. The shift circuit 3b receives the carry signal 12. A carry signal 13 outputted by the shift circuit 3b is inputted to the latch circuit 4. A carry signal 113 is inputted to the shift circuit 3c as the data of the latch circuit 4, and a carry signal 114 outputted by the shift circuit 3c is inputted to the shift circuit 3d.

The first circuit 5 is for a least significant bit, and the fourth circuit 8 is for a most significant bit. The latch circuits 1a, 1b, 2c, and 2d fetch input data values when the clock P1 is "1", and when it is "0", the data values are latched. The latch circuits 2a, 2b, 1c and 1d fetch input data values when the clock P2 is "1", and when it is "0", the data values are latched. Neither of the shift circuits 3a, 3b, 3cor 3d is operated when a carry signal is "0" where the signal is not outputted. When an input value is "0", the output value becomes "0". When a carry signal is "1" where the signal is outputted, these shift circuits are operated, and in this case, if the input value is "0", the output value becomes "1". When no carry signal is outputted, the shift circuits are not operated, and when the input value is "1", the output value becomes "1". When a carry signal is outputted, the shifting is executed, and when the input value is "1", the output value becomes "0". In this case, the carry signal becomes "1", and a carry signal is outputted.

The count operation of the counter described above will be described with reference to the timing chart of FIG. 4 which shows the timing of signals.

Figure 4:
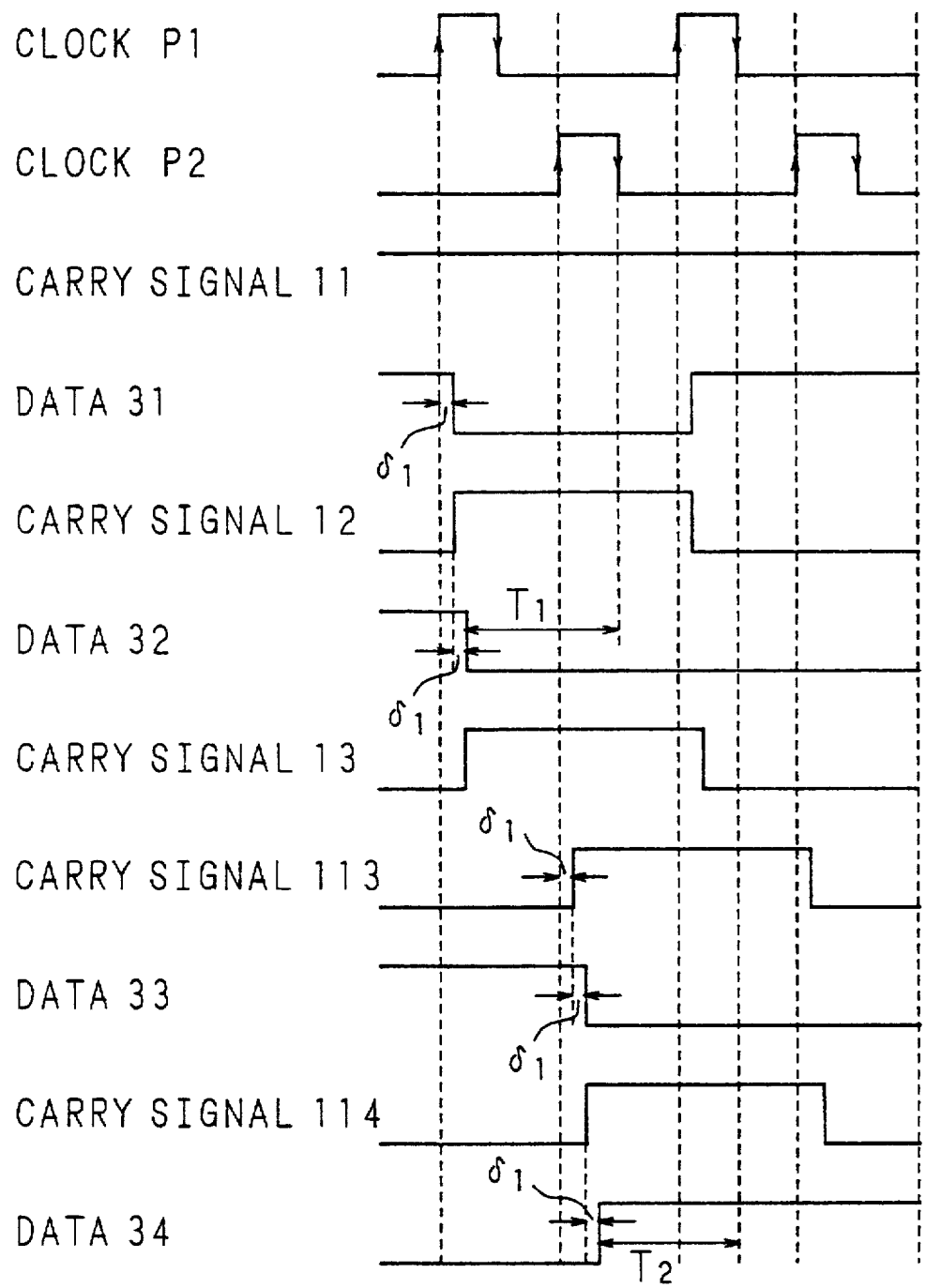
FIG. 4 is a timing chart showing the occurrence of signals from the counter of FIG. 3.

As shown in FIG. 4, the clocks P1 and P2 have the same frequency and the same waveform. The clock P2 is in synchronism with the clock P1 by a lag time of half cycle. As shown in FIG. 4, the level of the carry signal 11 is fixed to "1" which means that the carry signal 11 remains outputted.

Next, the counting process from "0, 1, 1, 1" to "1, 0, 0, 0" and from "1, 0, 0, 0" to "1, 0, 0, 1" will be described:

The data values 21 and 22 of the latch circuits 1a and 1b both become "1" in synchronism with the clock P1. As shown in FIG. 4, the carry signal 11 is outputted to drive the shift circuit 3a into the shift operation, and the data value 31 of the shift circuit 3a becomes "0", thereby enabling the shift circuit 3a to output the carry signal 12 and permitting the shift circuit 3b to execute the shift operation. At this stage, the data value 22 of the latch circuit 1b is "1", and as shown in FIG. 4, the data value 32 of the shift circuit 3b becomes "0", thereby outputting the carry signal 13 from the shift circuit 3b.

Then, the data values 31 and 32 of "0" are latched by the latch circuits 2a and 2b in synchronism with the clock P2. Furthermore, the data values 23 and 24 of the latch circuits 1c and 1d become "1" and "0" in synchronism with the clock P2, and the latch circuit 4 latches the carry signal 13, and outputs a carry signal 113 from the latch circuit 4 as shown in FIG. 4. In response to the carry signal 113 being "1" the shift circuit 3c is operated, and as shown in FIG. 4, the data value 33 of the shift circuit 3c becomes "0", and a carry signal 114 being "1" is outputted from the shift circuit 3c. In response to the carry signal 114, the shift circuit 3d is operated and the data value 34 of the shift circuit 3d becomes "1". In this way the count values become "1, 0, 0, 0".

The data values 33 and 34 of the shift circuit 3c and 3d are latched by the latch circuits 2c and 2d in synchronism with the clock P1, and the data values of the shift circuit 2a and 2b are latched by the latch circuits 1a and 1b, and the data values 21 and 22 of the latch circuits 1a and 1b both become "0". Because the carry signal 11 is outputted, the shift circuit 3a is operated but because the data value 21 of the latch circuit 1a is "0", as shown in FIG. 4, the data value 31 of the shift circuit 3a becomes "1" where the shift circuit 3a does not output the carry signal 12 which becomes "0". As a result, the shift circuit 3b will not be operated, and with the data value 22 of the latch circuit 1b being "0" as shown in FIG. 4, the data value 32 of the shift circuit 3b remains "0". At this stage, the shift circuit 3b does not output the carry signal 13.

Then, the data values 31 and 32 of the shift circuits 3a and 3b are respectively latched by the latch circuits 2a and 2b in synchronism with the next clock P2. The latch circuits 1c and 1d latch the data values of the latch circuit 2c and 3d, and the data values 23 and 24 of the latch circuits 1c and 1d become "0" and "1", respectively. At this stage, because the carry signal 13 is not inputted to the latch circuit 4, the carry signal 113 being "1" is not outputted from the latch circuit 4, and the shift circuit 3c is not operated. Because the data value 23 of the latch circuit 1c is "0", the data value 33 of the shift circuit 3c remains "0" as shown in FIG. 4. The shift circuit 3c does not output the carry signal 114 being "1" and the shift circuit 3d is not operated. As a result, the data value 24 of the latch circuit 1d is "1" and the data value 34 of the shift circuit 3d remains "1". In this way the count value becomes "1, 0, 0, 1".

Figure 1:
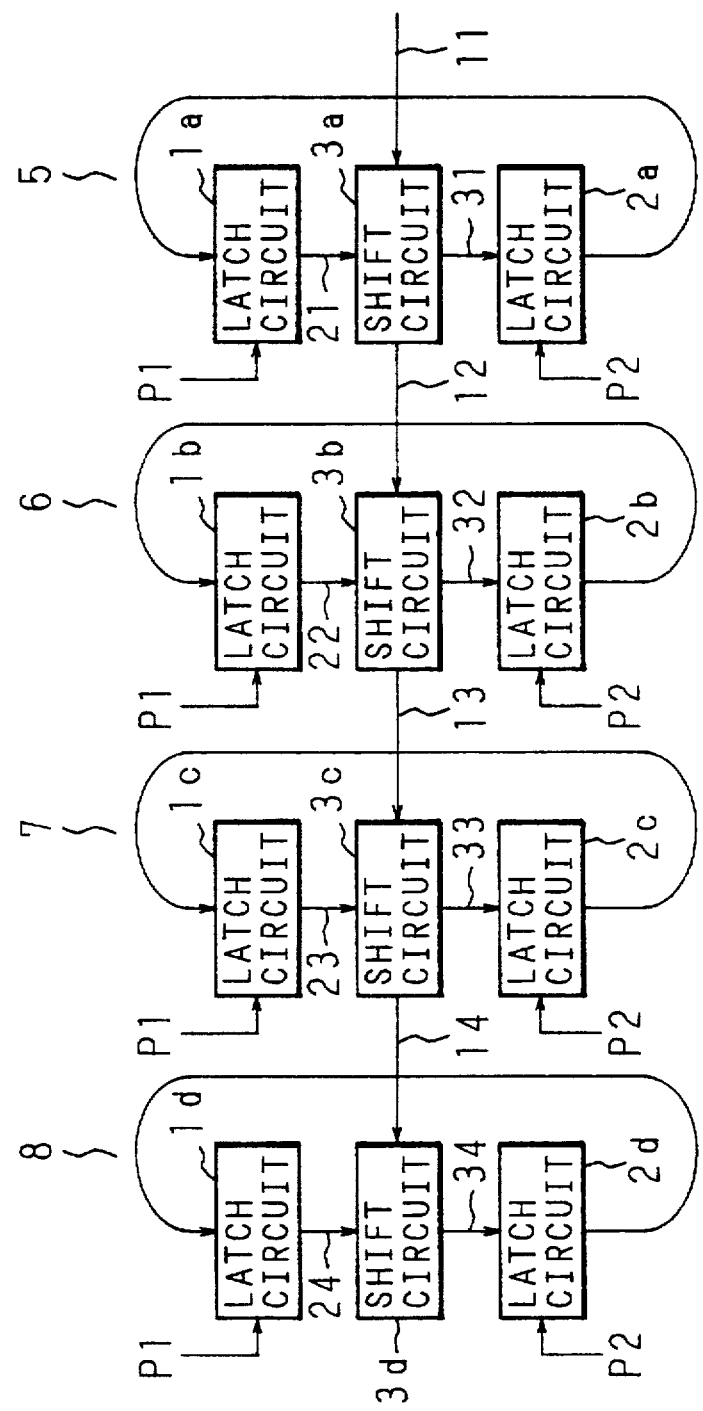
FIG. 1 is a block diagram illustrating the structure of a known counter.
Figure 2:
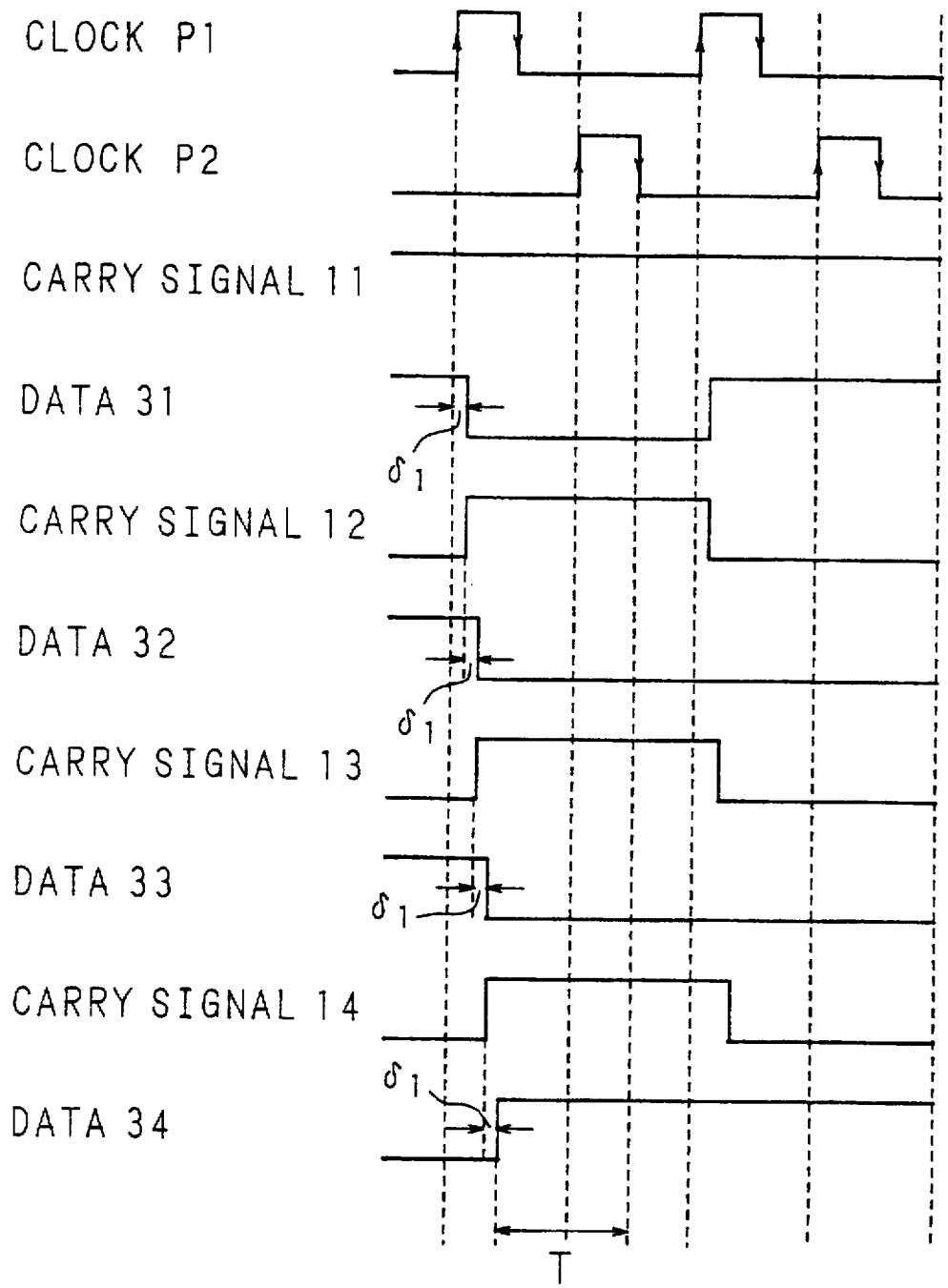
FIG. 2 is a timing chart showing the occurrence of signals from the counter of FIG. 1.

In the above-mentioned process the data value 31 is established upon lapse of a lag time $\delta_1$ by the shift circuit 3a from the rising point of time of the clock P1, and upon lapse of a further lag time P1 from that point of time by the shift circuit 3b the data value 32 is established. Furthermore, the data value 33 of the shift circuit 3c is established upon lapse of a lag time $\delta_1$ occurring in the latch circuit 4 from the rising point of time of the clock P2, and the data value 34 is established upon lapse of a further lag time $\delta_1$ from that point of time. In this way the sum of the lag times of all the shift circuits is divided into two portions; one being on the basis of the clocks P1 and the other being on the basis of the clock P2. Suppose that the period of time from the determination of the upper-order bits on the basis of the clock P1 up to a falling time of the clock P2 be $T_1$ and that the period of time from the determination of the upper-order bits on the basis of the clock P2 up to a falling time of the clock P1 be $T_2$. Unlike the prior art, the lag times of the shift circuits 3a, 3b, 3c and 3d are prevented from accumulating on the basis of the clock P1 but they are separately accumulated on the basis of the clock P1 and clock P2. Under this arrangement the period of time $T_1$ and $T_2$ can be prolonged that the period of time T shown in FIG. 2, and the cycle of each of the clocks P1 and P2 can be shortened, thereby heightening the frequency of each clock P1 and P2. Thus a speedy count operation is achieved.

Embodiment 2

Figure 5:
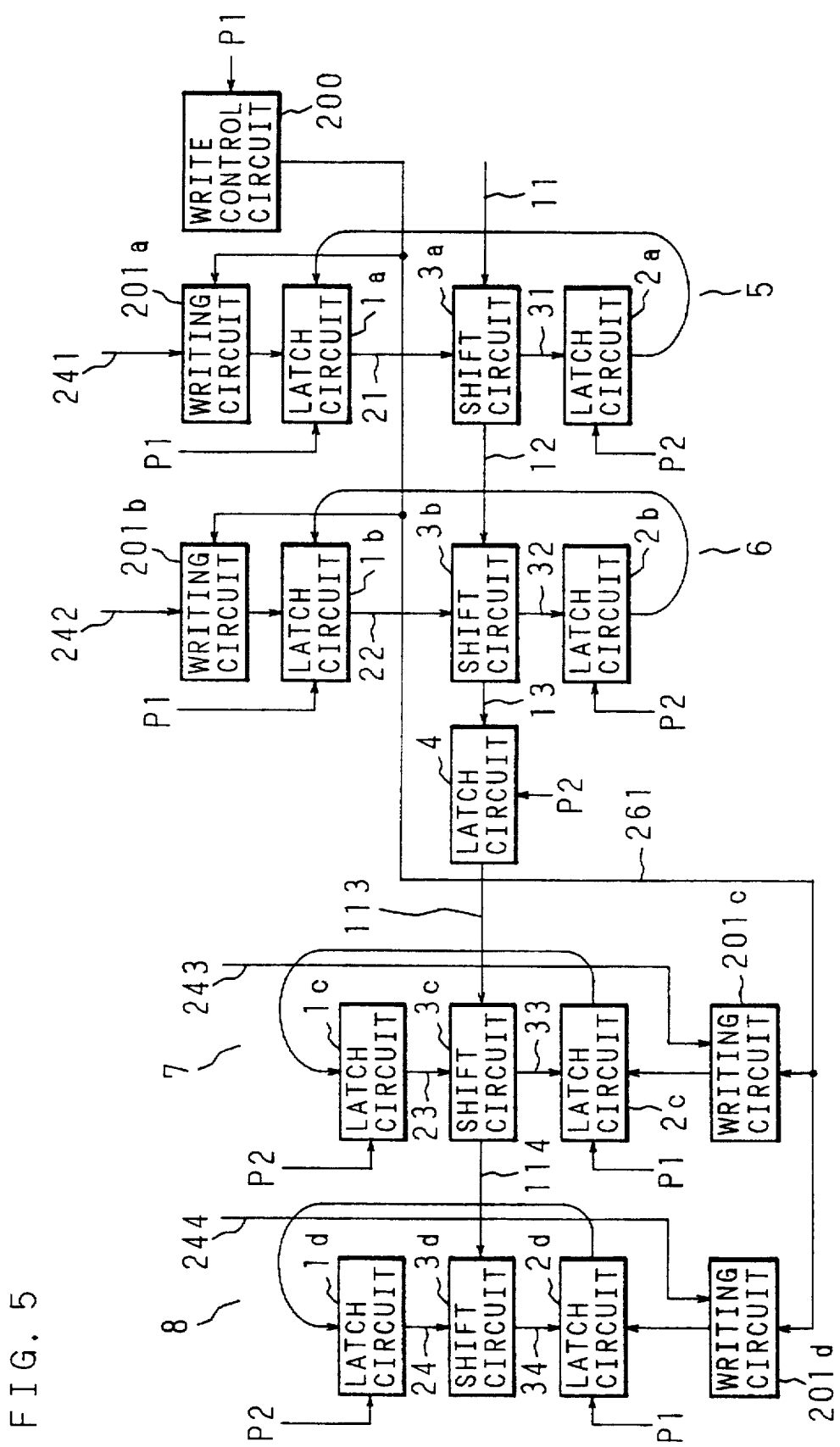
FIG. 5 is a block diagram illustrating a second embodiment of the invention.

FIG. 5 is a block diagram illustrating the counter according to Embodiment 2. A clock P1 is inputted to a write control circuit 200. In synchronism with the clock P1, the write control circuit 200 outputs a write control signal 261 to writing circuits 201a, 201b, 201c and 201d, each of which functions as a latch circuit. The writing circuits 201a, 201b, 201c, and 201d receive writing bit-data 241, 242, 243, and 244, respectively. The writing circuits 201a, 201b, 201c, and 201d write the writing data 241, 242, 243, and 244 in the latch circuits 1a, 1b, 2c, and 2d. The other parts of structure are the same as those of the counter shown in FIG. 3, and like components are designated by like reference numerals to those in FIG. 3.

The illustrated counter is operated as follows:

The count operation on the basis of the clocks P1 and P2, and the carry signals 11, 12, 113 and 114 is carried out in the same manner as shown in FIG. 3. In the cycle of writing the count data the write control circuit 200 outputs a write control signal 261 in synchronism with the clock P1. In response to the write control signal 261 the writing circuits 201a, 201b, 201c, and 201d write the writing data 241, 242, 243, and 244 in the latch circuits 1a, 1b, 2c, and 2d so that the data values in the latch circuits 1a, 1b, 2c, and 2d are rewritten. As a result, the data values 21 and 22 of the writing circuits 201a and 201b become writing data 241 and 242, and the data values 21 and 22 of the writing circuits 201c and 201d are shifted into data 31 and 32 by the shift circuits 3a and 3b. The data values 31 and 32 are latched by the latch circuits 2a and 2b in synchronism with the clock P2. The data values 23 and 24 of the latch circuits 1c and 1d turn into writing data 243 and 244 written in the latch circuits 2c and 2d. The writing data 243 and 244 are shifted by the shift circuits 3c and 3d into data values 33 and 34. In this way the count values of the counter can be rewritten during the count operation.

Embodiment 3

Figure 6:
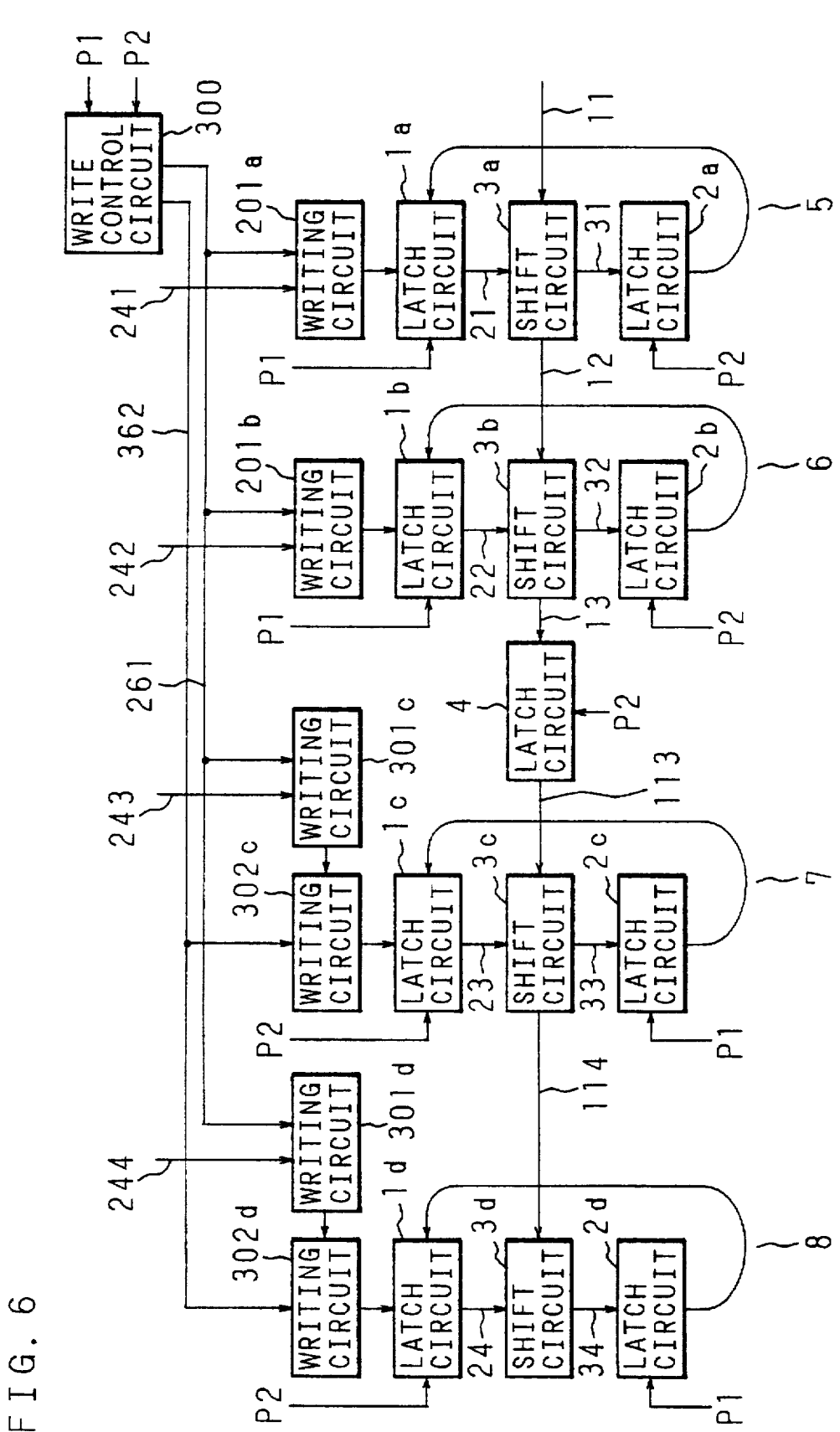
FIG. 6 is a block diagram illustrating a third embodiment of the invention.

FIG. 6 is a block diagram illustrating the counter according to Embodiment 3. Clocks P1 and P2 are inputted to a write control circuit 300, and in synchronism with the clock P1 the circuit 300 outputs a write control signal 261 to writing circuits 201a and 201b and writing circuits 301c and 301d, each functioning as latch circuits. A write control circuit 300 outputs a write control signal 362 in synchronism with the clock P2, and the write control signal 362 is inputted to the writing circuits 302c and 302d functioning as latch circuits. The writing circuits 201a and 201b receive writing bit-data 241 and 242, respectively. The writing circuits 301c and 301d receive the writing data 243 and 244, respectively. The writing circuits 201a and 201b write the writing data 241 and 242 in the latch circuits 1a and 1b. The data of the writing circuits 301c and 301d are written in the writing circuits 302c and 302d. The data of the writing circuits 302c and 302d are written in the latch circuits 1c and 1d. The other parts of structure are the same as those of the counter shown in FIG. 3, and like components are designated by like reference numerals to those in FIG. 3.

The illustrated counter is operated as follows:

The count operation on the basis of the clocks P1 and P2, and the carry signals 11, 12, 113 and 114 is carried out in the same manner as shown in FIG. 3.

In the cycle of writing the count data the write control circuit 300 outputs a write control signal 261 in synchronism with the clock P1. In response to the write control signal 261 the writing circuits 201a and 201b rewrite the data of the latch circuits 1a and 1b into writing data 241 and 242. The writing circuits 301c and 301d latch the writing data 243 and 244. As a result, the data values 21 and 22 of the latch circuits 1a and 1b turn respectively into the writing data 241 and 242 which are then shifted by the shift circuits 3a and 3b to turn into the data values 31 and 32 of the shift circuits 3a and 3b. The write control circuit 300 outputs a write control signal 362 in synchronism with the clock P2. In response to the write control signal 362 each of the writing circuits 302c and 302d rewrite the data of the latch circuits 1c and 1d into writing data 243 and 244, and the data values 23 and 24 of the latch circuits 1c and 1d turn into the writing data 243 and 244. The rewritten data values 23 and 24 are shifted by the shift circuits 3c and 3d into the data values 33 and 34 of the shift circuits 3c and 3d. In this way Embodiment 3 permits the count values of the counter to be rewritten during the count operation.

Embodiment 4

Figure 7:
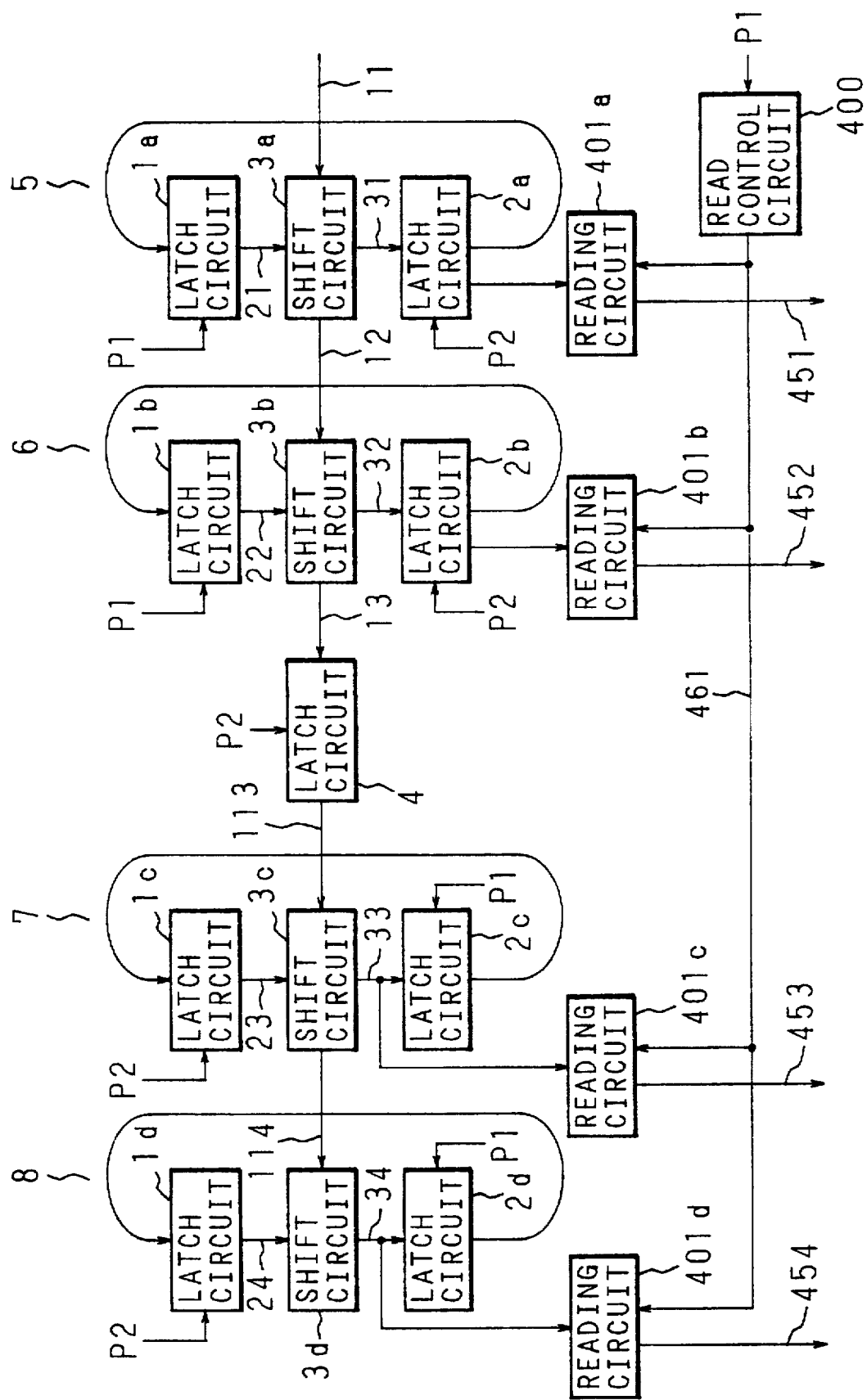
FIG. 7 is a block diagram illustrating a fourth embodiment of the invention.

FIG. 7 is a block diagram illustrating the counter according to Embodiment 4. A clock P1 is inputted to a read control circuit 400, and in synchronism with the clock P1 the circuit 400 outputs a read control signal 461 to reading circuits 401a, 401b, 401c, and 401d, each functioning as a latch circuit. The data values of the latch circuits 2a and 2b are respectively inputted to the reading circuits 401a and 401b. Data values 33 and 34 outputted by the shift circuits 3c and 3d are inputted to the reading circuits 401c and 401d. The reading circuits 401a, 401b, 401c, and 401d output reading data 451, 452, 453 and 454, respectively.

The illustrated counter is operated as follows:

The count operation on the basis of the clocks P1 and P2, and the carry signals 11, 12, 113 and 114 is carried out in the same manner as shown in FIG. 3.

In the cycle of reading the count data the read control circuit 400 outputs a read control signal 461 in synchronism with the clock P1. In response to the read control signal 461 the reading circuits 401a and 401b latch the data of the latch circuits 2a and 2b. The reading circuits 401c and 401b latch the data values 33 and 34 outputted by the shift circuits 3c and 3d. As a result, the data values latched by the reading circuits 401a, 401b, 401c, and 401d are respectively outputted as data 451, 452, 453, and 454. This permits a count value to be read out during the count operation. In addition, the reading circuit can be simplified, and the pattern area can be reduced.

Embodiment 5

Figure 8:
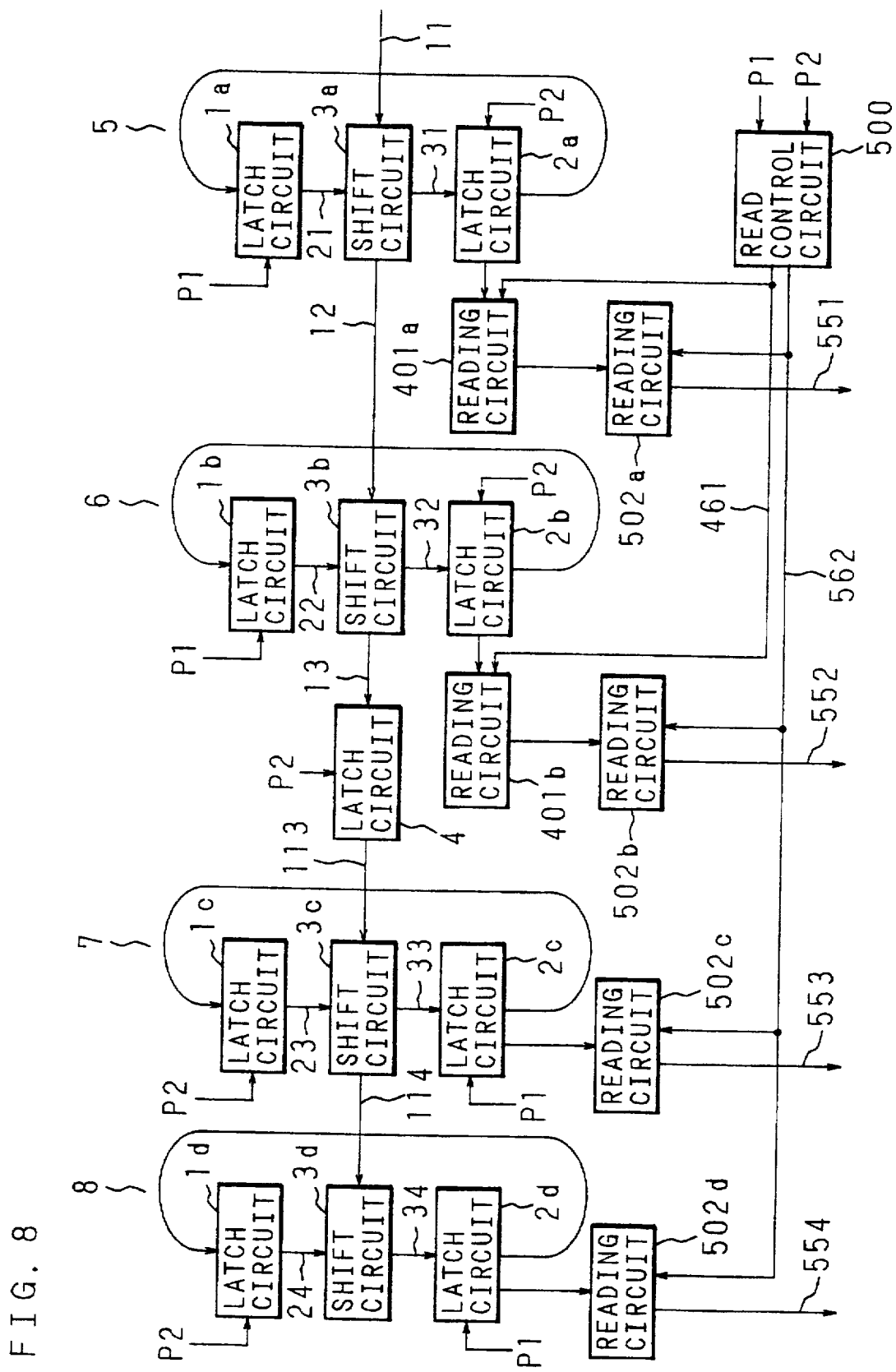
FIG. 8 is a block diagram illustrating a fifth embodiment of the invention.

FIG. 8 is a block diagram illustrating the counter according to Embodiment 5. Clocks P1 and P2 are inputted to a read control circuit 500, and in synchronism with the clock P1 the circuit 500 outputs a read control signal 461 which is then inputted to reading circuits 401a and 401b, both functioning as latch circuits. In synchronism with the clock P2 the read control circuit 500 outputs a read control signal 562 which is inputted to reading circuits 502a, 502b, 502c, and 502d. The data values of the latch circuits 2a and 2b are inputted to the reading circuits 401a and 401b, respectively. The data values of the reading circuits 401a and 401b are inputted to the reading circuits 502a and 502b, which then output reading data 551 and 552, respectively. The data values of the latch circuits 2c and 2d are respectively inputted to reading circuits 502c and 502d. The reading circuits 502c and 502d output reading data 553 and 554.

The illustrated counter is operated as follows:

The count operation on the basis of the clocks P1 and P2, and the carry signals 11, 12, 113 and 114 is carried out in the same manner as shown in FIG. 3.

In the cycle of reading the count data the read control circuit 500 outputs the read control signal 461 in synchronism with the clock P1. In response to the read control signal 461 the latch circuits 401a and 401b latch the data values of the latch circuits 2a and 2b. In synchronism with the clock P2 the read control circuit 500 outputs the read control signal 562. In response to the read control signal 562, the reading circuits 502a and 502b latch the data values of the reading circuits 401a and 401b, and the reading circuits 502c and 502d latch the data values of the latch circuits 2c and 2d, and output the data values 551, 552, 553, and 554 each latched by the reading circuits 502a, 502b, 502c, and 502d, respectively. This permits the count values to be read out during the count operation. In addition, under a high frequency of the clock data can be precisely read.

In describing Embodiments 1, 2, 3, 4, and 5 an up-counter has been taken as an example, but the same effects can be achieved from a down-counter in which the carry signals are replaced with borrow signals on the basis of which the countdown operations are carried out.

Embodiment 6

Figure 9:
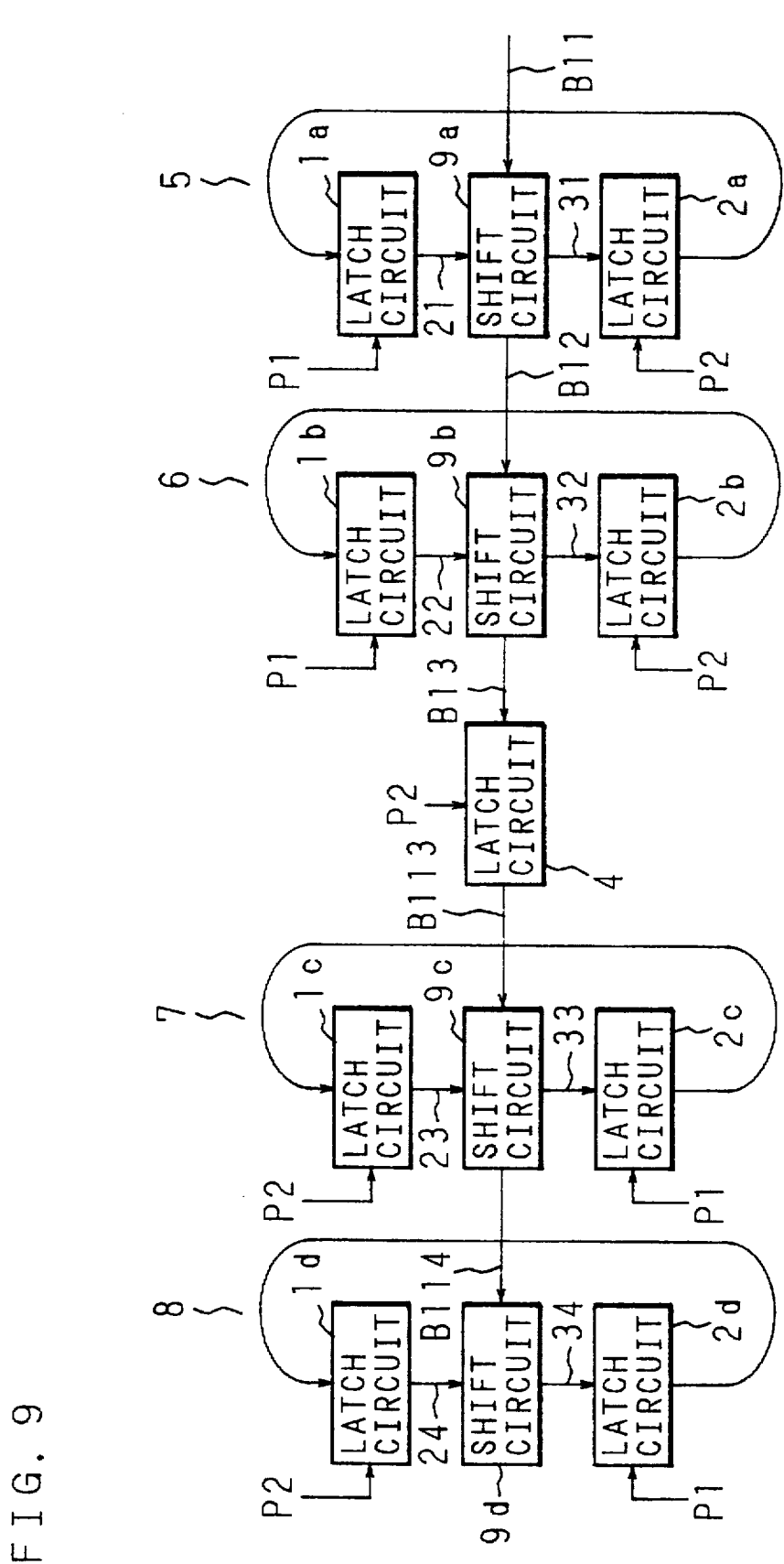
FIG. 9 is a block diagram illustrating a sixth embodiment of the invention.

FIG. 9 is a block diagram illustrating the counter according to Embodiment 6. The counter of Embodiment 8 is constructed in the same manner as shown in FIG. 3, except for the use of shift circuits 9a, 9b, 9c, and 9d, and the replacement of the carry signals 11, 12, 13, 113, and 114 with borrow signals B11, B12, B13, B113 and B114. In FIG. 9 like components and elements are designated by like reference numerals to those in FIG. 3.

Embodiment 7

Figure 10:
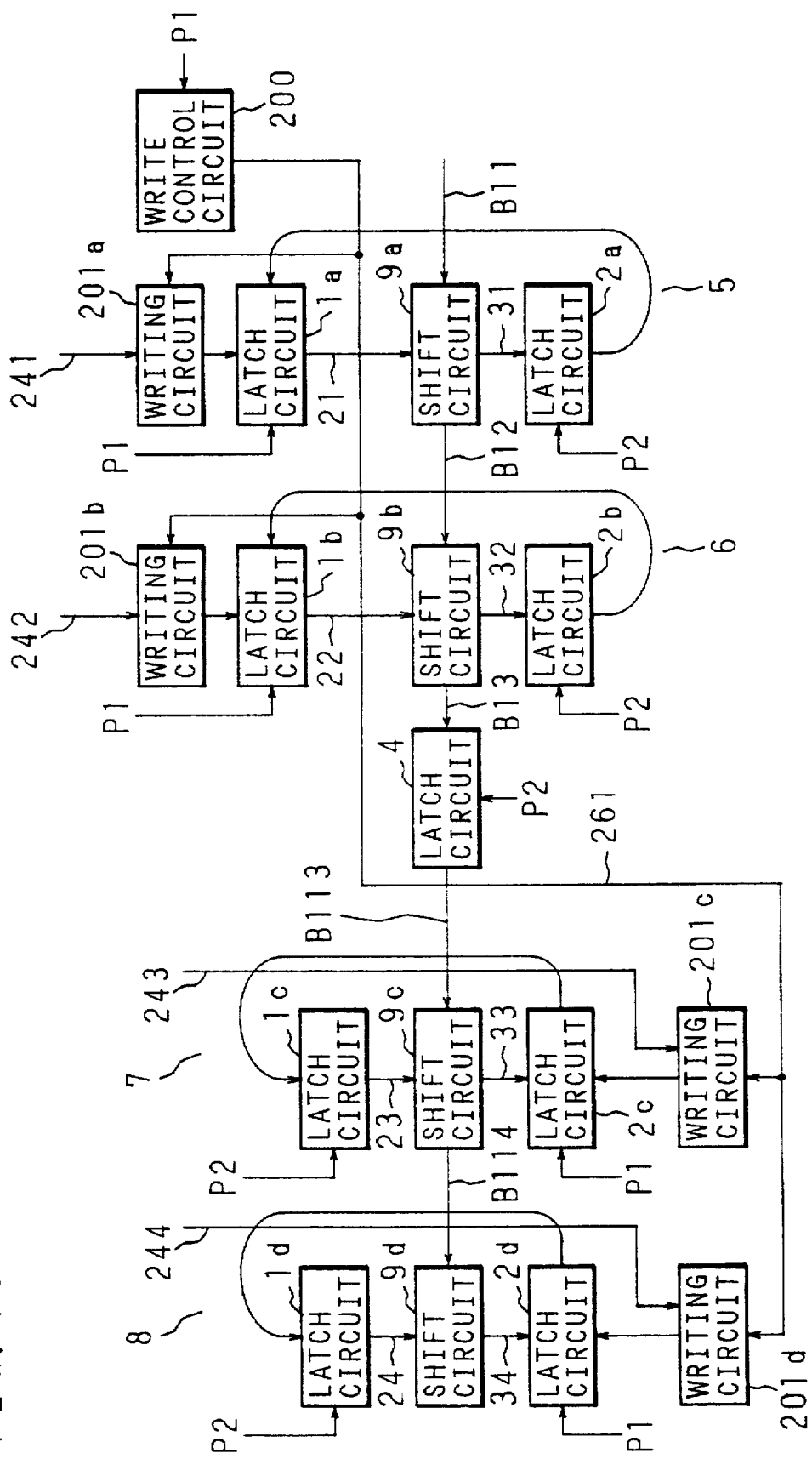
FIG. 10 is a block diagram illustrating a seventh embodiment of the invention.

FIG. 10 is a block diagram illustrating the counter according to Embodiment 7. The counter of Embodiment 7 is constructed in the same manner as shown in FIG. 5 except for the use of shift circuits 9a, 9b, 9c, and 9d, and the replacement of the carry signals 11, 12, 13, 113, and 114 with borrow signals B11, B12, B13, B113, and B114. In FIG. 10, like components and elements are designated by like reference numerals to those in FIG. 5.

Embodiment 8

Figure 11:
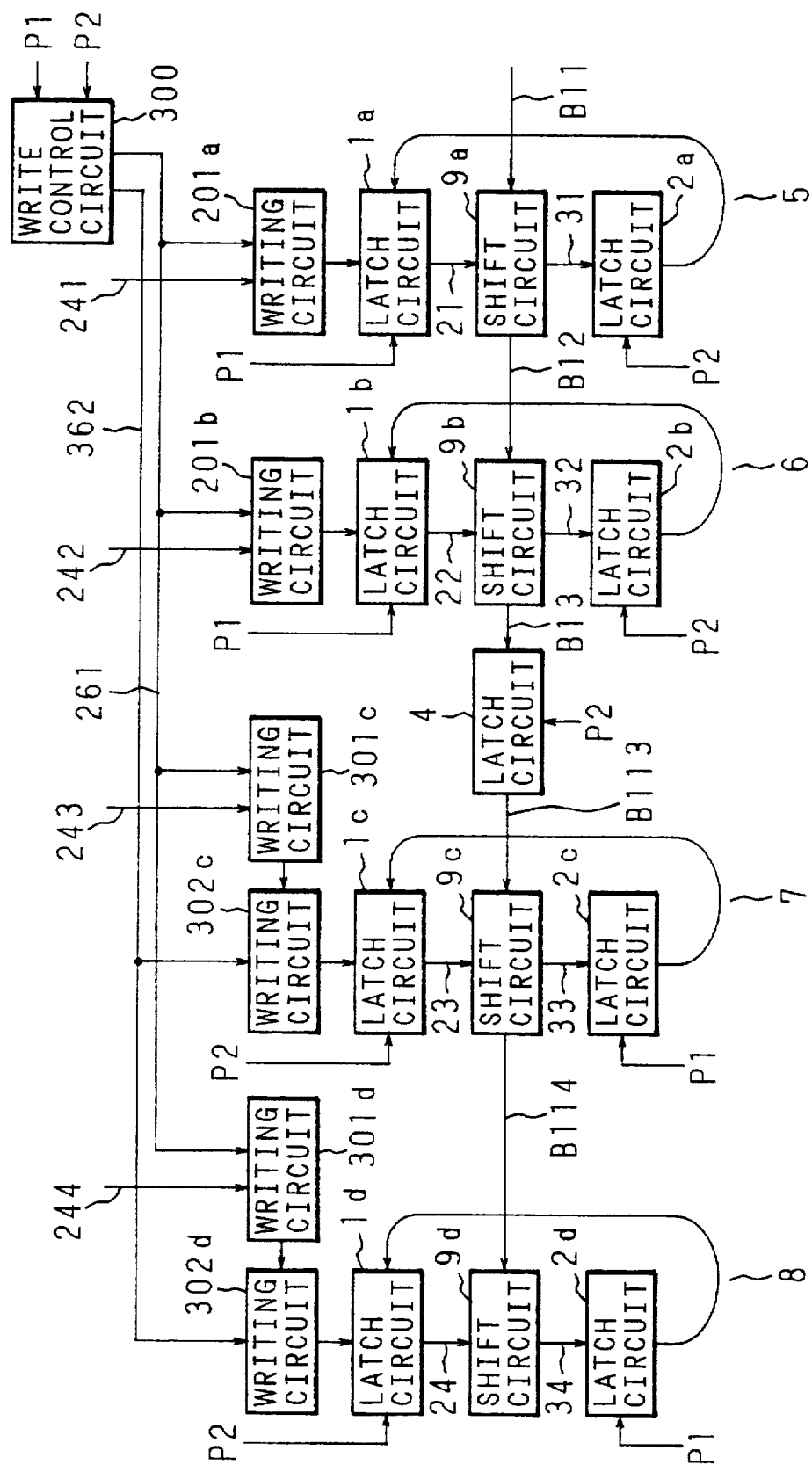
FIG. 11 is a block diagram illustrating a eighth embodiment of the invention.

FIG. 11 is a block diagram illustrating the counter according to Embodiment 8. The counter of Embodiment 8 is constructed in the same manner as shown in FIG. 6, except for the use of shift circuits 9a, 9b, 9c, and 9d, and the replacement of the carry signals 11, 12, 13, 113, and 114 with borrow signals B11, B12, B13, B113, and B114. In FIG. 11, like components and elements are designated by like reference numerals to those in FIG. 6.

Embodiment 9

Figure 12:
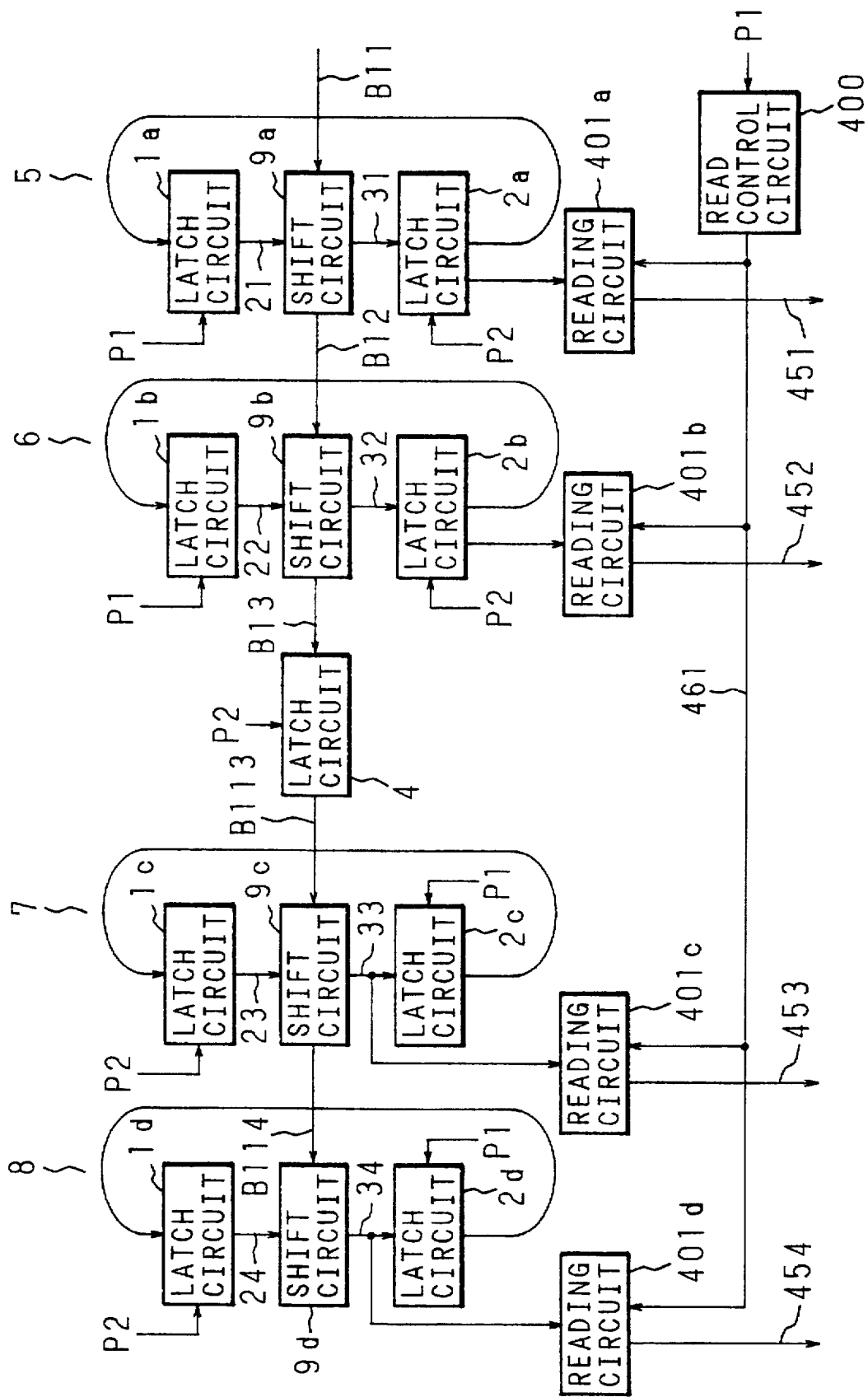
FIG. 12 is a block diagram illustrating a ninth embodiment of the invention.

FIG. 12 is a block diagram illustrating the counter according to Embodiment 9. The counter of Embodiment 9 is constructed in the same manner as shown in FIG. 7, except for the use of shift circuits 9a, 9b, 9c, and 9d, and the replacement of the carry signals 11, 12, 13, 113, and 114 with borrow signals B11, B12, B13, B113, and B114. In FIG. 12, like components and elements are designated by like reference numerals to those in FIG. 7.

Embodiment 10

Figure 13:
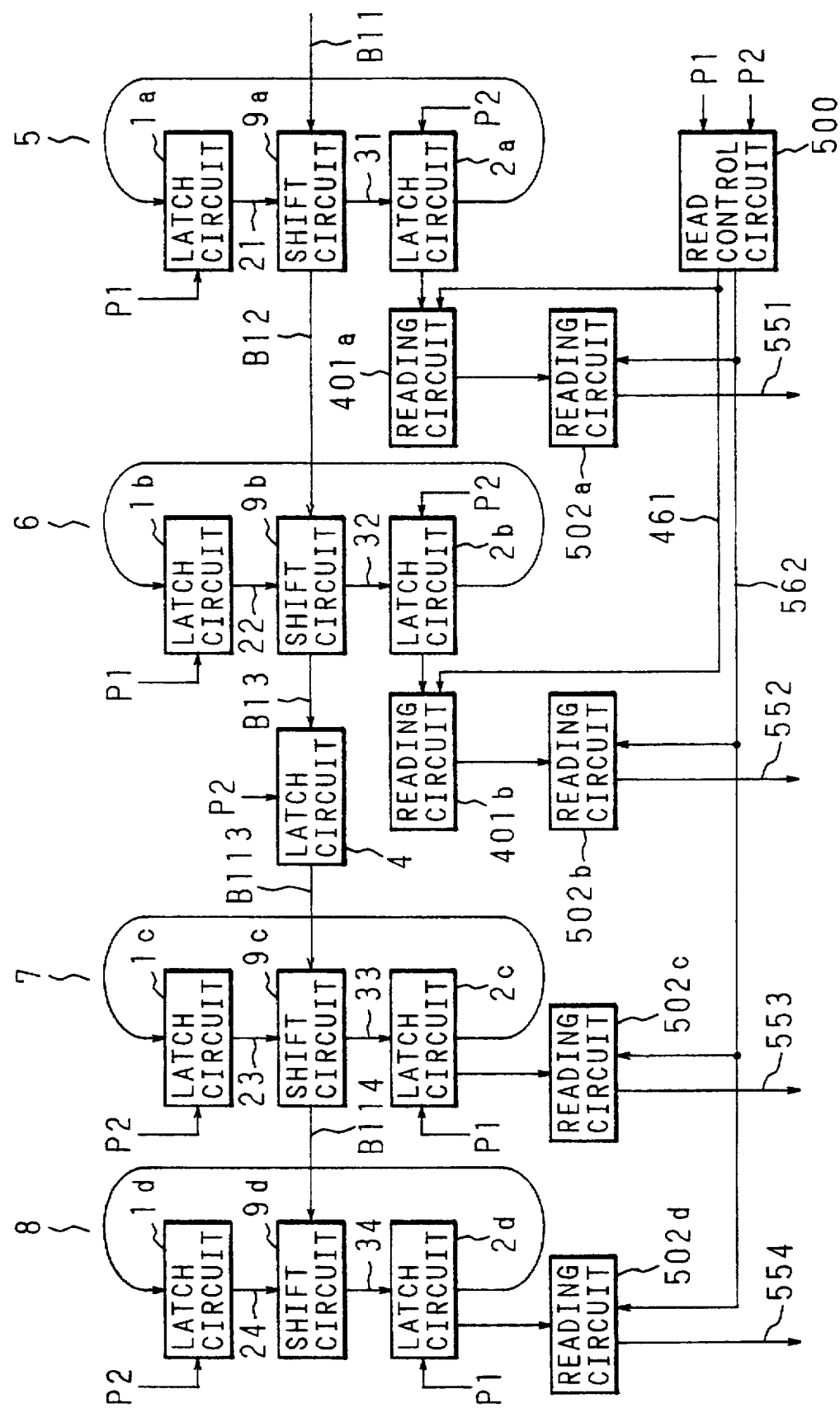
FIG. 13 is a block diagram illustrating a tenth embodiment of the invention.

FIG. 13 is a block diagram illustrating the counter according to Embodiment 10. The counter of Embodiment 10 is constructed in the same manner as shown in FIG. 8, except for the use of shift circuits 9a, 9b, 9c, and 9d, and the replacement of the carry signals 11, 12, 13, 113, and 114 with borrow signals B11, B12, B13, B113, and B114. In FIG. 13, like components and elements are designated by like reference numerals to those in FIG. 8.

In Embodiments 6 to 10 the shift circuits 9a, 9b, 9c, and 9d execute the shift operation as shown in TABLE 2:

TABLE 2

| TYPE | 1 | 2 | 3 | 4 |
| --- | --- | --- | --- | --- |
| Input Value | 0 | 1 | 0 | 1 |
| Input Borrow Signal | 0 | 0 | 1 | 1 |
| Output Value | 0 | 1 | 1 | 0 |
| Output Carry Signal | 0 | 0 | 1 | 0 |

In describing Embodiments 1 to 10 a 4-bit counter has been taken as an example but they are not limited to the 4-bit counter. The greater value the bit number has, the higher counting speed the counter obtains.

As is described above, according to the present invention, since the shift timing of a shift circuit for upper-order bits can be delayed by latching a shift instruction data outputted from a lower-order bit to an upper-order bit halfway, the frequency of a clock for putting a counter into count operation can be heightened, thereby providing a high speed counter.

Furthermore, even if the shift timings are different between the upper-order bits and lower-order bits, the count value can be rewritten during the count operation.

In addition, even if the shift timings are different between the upper-order bits and lower-order bits, the count value can be read during the count operation.

As this invention may be embodied in several forms without departing from the spirit of essential characteristics thereof, the present embodiments are therefore illustrated and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A counter circuit comprising:

a first counting division circuit including:

a first latch circuit for latching data synchronously with a first clock;

a first shift circuit for fetching data latched by the first latch circuit and outputting data shifted in response to a shift instruction data and outputting the shift instruction data when a predetermined shift operation occurs; and a second latch circuit for latching data outputted by the first shift circuit synchronously with a second clock and latching the latched data from the second latch circuit to the first latch circuit;

a second counting division circuit including:

a third latch circuit for latching data synchronously with the second clock;

a second shift circuit for fetching data latched by the third latch circuit and outputting data shifted in response to a shift instruction data and outputting the shift instruction data when a predetermined shift operation occurs; and a fourth latch circuit for latching data outputted by the second shift circuit synchronously with the first clock, and latching the latched data from the fourth latch circuit to the third latch circuit; and a fifth latch circuit for latching the shift instruction data outputted from the first shift circuit and outputting the latched data from the fifth latch circuit to the second shift circuit;

wherein the second latch circuit and the third latch circuit, respectively, obtain data from a lower-order bit and an upper-order bit of a count value obtained by the counting of the first clock and second clock.

2. The counter circuit according to claim 1, wherein the first counting division circuit and the second counting division circuit comprises, respectively, of a plurality of first counting division circuits and a plurality of second counting division circuits;

each of the first shift circuits consecutively outputting the shift instruction data from a lower-order bit side to an upper-order bit side;

each of the second shift circuits consecutively outputting the shift instruction data from a lower-order bit side to an upper-order bit side; and each of the fifth latch circuit latching the shift instruction data outputted from a final stage of the first shift circuits, and outputting the latched shift instruction data to a first stage of the second shift circuits.

3. The counter circuit according to claim 1, further comprising data-writing circuits for writing data respectively in the first latch circuit and the fourth latch circuit.

4. The counter circuit according to claim 1, further comprising data-writing circuits for writing data, respectively, in the first latch circuit and the third latch circuit.

5. The counter circuit according to claim 1, further comprising:

a first data-reading circuit for reading data in the first latch circuit; and a second data-reading circuit for reading data inputted to the third latch circuit.

6. The counter circuit according to claim 1, further comprising:

a third data-reading circuit for reading data from the second latch circuit;

a sixth latch circuit for latching the data read by the third data-reading circuit; and a seventh latch circuit for latching the data of the fourth latch circuit.

7. The counter circuit according to claim 1, wherein the shift instruction data is a carry signal.

8. The counter circuit according to claim 1, wherein the shift instruction data is a borrow signal.

9. The counter circuit according to claim 2, further comprising data-writing circuits for writing data in the first latch circuits and the fourth latch circuits.

10. The counter circuit according to claim 2, further comprising data-writing circuits for writing data in the first latch circuits and the third latch circuits.

11. The counter circuit according to claim 2, further comprising:

first data-reading circuits for reading data from the first latch circuits; and second data-reading circuits for reading data inputted to the third latch circuits.

12. The counter circuit according to claim 2, further comprising:

third data-reading circuits for reading data from the second latch circuits;

sixth latch circuits for latching the data read by the third data-reading circuits; and seventh latch circuits for latching the data of the fourth latch circuits.

13. The counter circuit according to claim 2, wherein the shift instruction data is a carry signal.

14. The counter circuit according to claim 2, wherein the shift instruction data is a borrow signal.

* * * * *